US008665609B2

(12) United States Patent
Tamamoto et al.

(10) Patent No.: US 8,665,609 B2
(45) Date of Patent: Mar. 4, 2014

(54) KEY DEVICE AND ELECTRONIC EQUIPMENT

(75) Inventors: Shinichi Tamamoto, Tokyo (JP); Yuichi Nishimura, Saitama (JP)

(73) Assignee: Casio Computer Co., Ltd., Tokyo (JP)

( * ) Notice: Subject to any disclaimer, the term of this patent is extended or adjusted under 35 U.S.C. 154(b) by 393 days.

(21) Appl. No.: 13/083,743

(22) Filed: Apr. 11, 2011

(65) Prior Publication Data

US 2011/0249412 A1 Oct. 13, 2011

(30) Foreign Application Priority Data

Apr. 12, 2010 (JP) ................................ 2010-091110

(51) Int. Cl.
*H05K 7/02* (2006.01)
*H05K 7/04* (2006.01)

(52) U.S. Cl.
USPC ........................................ 361/807; 361/810

(58) Field of Classification Search
USPC ........................................ 361/807, 809–810
See application file for complete search history.

(56) References Cited

U.S. PATENT DOCUMENTS

| | | | | | |
|---|---|---|---|---|---|
| 3,849,611 | A * | 11/1974 | Walker, Jr. | ........ | 200/5 A |
| 4,056,700 | A * | 11/1977 | Stannek | ........ | 200/534 |
| 4,363,942 | A * | 12/1982 | Deeg et al. | ........ | 200/5 A |
| 5,574,446 | A * | 11/1996 | Dittrich et al. | ........ | 341/22 |
| 6,657,147 | B2 * | 12/2003 | Tsutsui et al. | ........ | 200/517 |

FOREIGN PATENT DOCUMENTS

| | | | |
|---|---|---|---|
| JP | 62-086022 | U | 6/1987 |
| JP | 2006-042215 | A | 2/2006 |
| JP | 2007-109486 | A | 4/2007 |

OTHER PUBLICATIONS

Japanese Office Action dated Aug. 30, 2011 (and English translation thereof) in counterpart Japanese Application No. 2010-091110.

* cited by examiner

*Primary Examiner* — Hung S Bui
(74) *Attorney, Agent, or Firm* — Holtz, Holtz, Goodman & Chick, PC

(57) ABSTRACT

A key device includes: a chassis which has an opening divided by one of a vertical rib and a horizontal rib; a plurality of keys which are arranged along the opening; and a substrate which is housed in the chassis, wherein the rib is engaged with the substrate.

6 Claims, 6 Drawing Sheets

KEY DEVICE AND ELECTRONIC EQUIPMENT

CROSS-REFERENCE TO RELATED APPLICATIONS

This application is based upon and claims the benefit of priority from the prior Japanese Patent Application No. 2010-091110 filed on 12 Apr. 2010, the entire contents of which are incorporated herein by reference.

BACKGROUND OF THE INVENTION

1. Field of the Invention

The present invention relates to a key device miniaturized by clearing one of vertical and horizontal ribs which divide an opening of a chassis into a plurality of spaces for arranging keys, and electronic equipment equipped with the key device.

2. Description of Related Art

A conventional key device of a desktop calculator or the like has had a configuration in which keytops each having retaining flanges are positioned in an opening of a chassis of the desktop calculator, which opening is divided into a plurality of spaces by vertical and horizontal ribs. However, in order to miniaturize the key device, a configuration in which one of the vertical and horizontal ribs dividing the opening is cleared has been desired. In order to achieve such configuration, it has also been necessary to clear the flanges of each of the keytops.

For example, Japanese Patent Application Laid-Open Publication No. 2007-109486 proposes a key switch configuration in which keytops each having no flange are adhered on a base film.

Although the keytops disclosed in the above patent document are provided with no flange, adhering such keytops onto the base film becomes necessary.

However, there is a problem that adhering the keytops onto the base film requires high costs.

Moreover, when clearing one of the vertical and horizontal ribs provided in the chassis for arranging keys, strength reduction of the chassis becomes a problem.

SUMMARY OF THE INVENTION

It is an object of the present invention to ensure strength of a chassis while miniaturizing a key device by clearing one of the vertical and horizontal ribs which divide an opening of the chassis into a plurality of spaces for arranging keys.

According to a first aspect of the present invention, there is provided a key device including: a chassis which has an opening divided by one of a vertical rib and a horizontal rib; a plurality of keys which are arranged along the opening; and a substrate which is housed in the chassis, wherein the rib is engaged with the substrate.

BRIEF DESCRIPTION OF THE DRAWINGS

The present invention will sufficiently be understood by the following detailed description and accompanying drawing, but they are provided for illustration only, and not for limiting the scope of the invention.

DETAILED DESCRIPTION OF THE PREFERRED EMBODIMENTS

An embodiment of the present invention will be described in detail with reference to the drawings.

Figure 1:
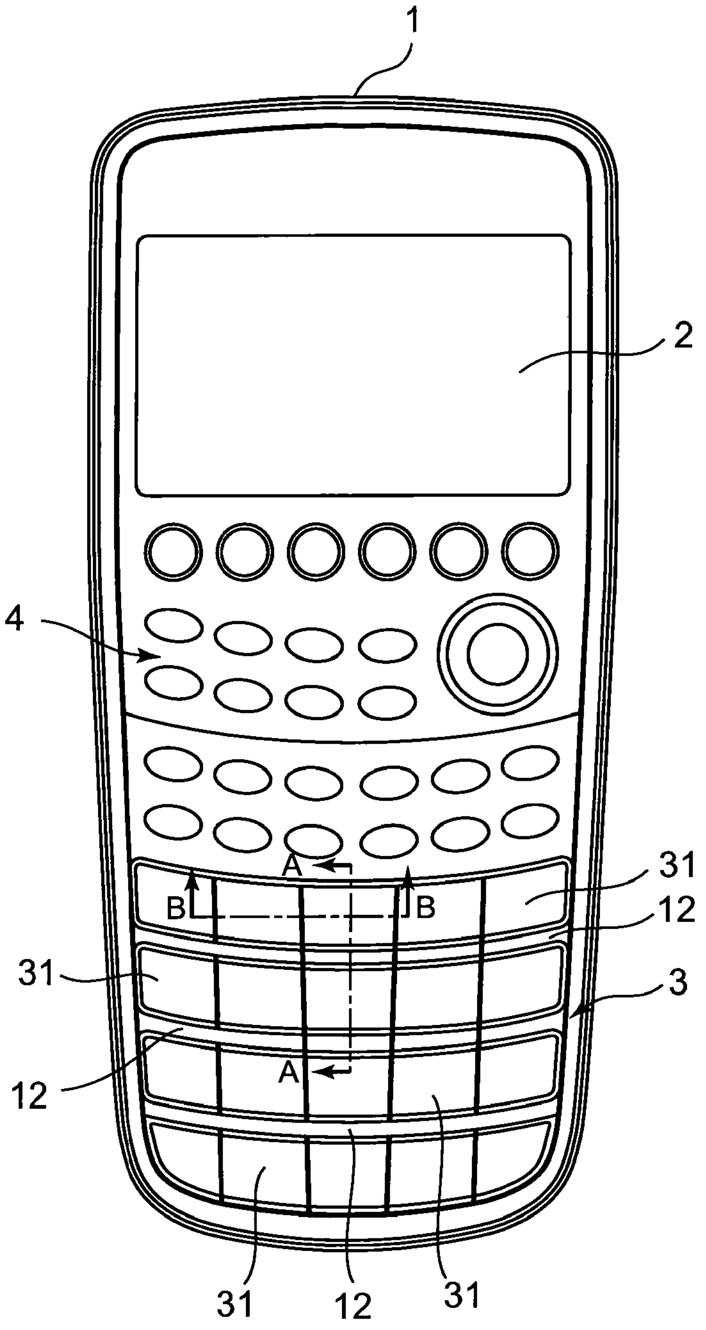
FIG. 1 is a front view of a desktop calculator and shows a configuration of electronic equipment according to an embodiment to which the present invention is applied.

FIG. 1 shows a desktop calculator as a configuration of electronic equipment according to one embodiment to which the present invention is applied. In FIG. 1, reference number 1 indicates a chassis, reference number 2 indicates a display section, reference number 3 indicates a key device according to the present invention, and reference number 4 indicates another key device.

In the illustrated example, the chassis 1 is equipped with the display section 2 in an upper portion thereof, the key device 3 of the present invention in a lower portion thereof, and the another key device 4 in a middle portion thereof.

Figure 2:
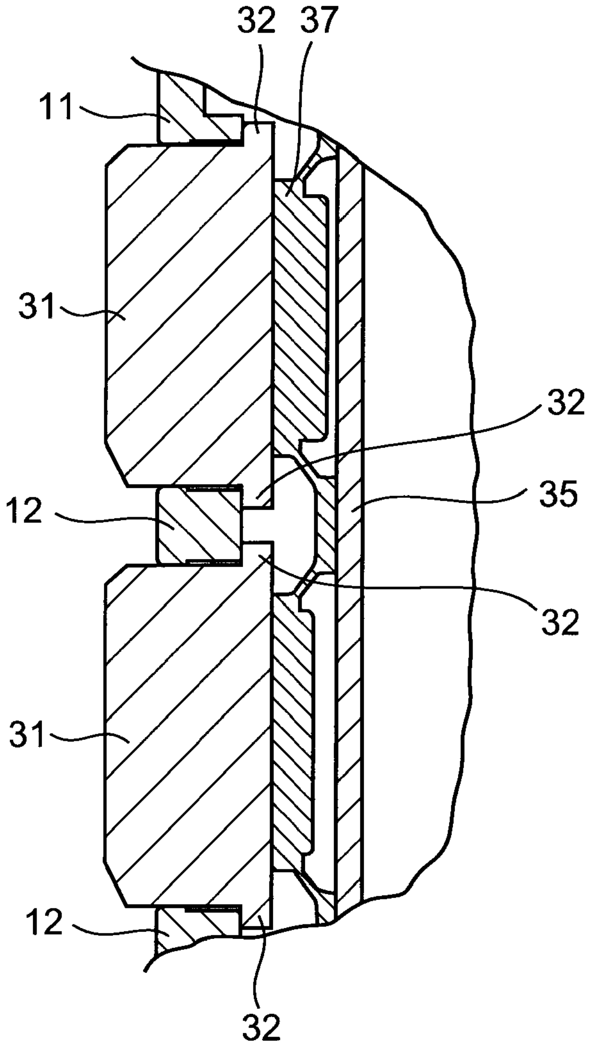
FIG. 2 is an enlarged sectional view along arrowed line A-A of FIG. 1.
Figure 3:
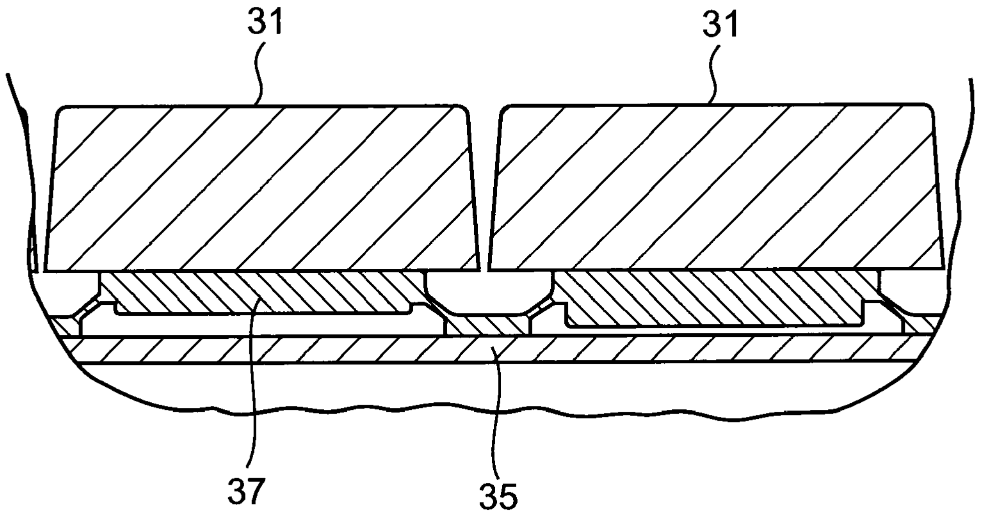
FIG. 3 is an enlarged sectional view along arrowed line B-B of FIG. 1.

Each of FIGS. 2 and 3 shows a cross section of the key device 3 according to the present invention. In each of FIGS. 2 and 3, reference number 11 indicates an upper case, reference number 12 indicates a horizontal rib, reference numbers 31 indicate keys, reference number 35 indicates a substrate, and reference number 37 indicates an inner rubber.

As illustrated in the drawings, in the lower portion of the upper case 11 of the chassis 1, only the horizontal ribs 12 which divide an opening into upper parts and lower parts for horizontally arranging the keys 31 of the key device 3 of the present invention are formed, and no vertical rib is formed.

Each of the keys 31 is retained so as not to fall off, with flanges 32 abutting against upper and lower portions of the opening of the upper case 11, which opening is divided into a plurality of spaces by the horizontal rib 12. Concretely, the flanges 32 abut against backsides of the horizontal ribs 12, and backsides of parts of the upper case 11, which parts are at a peripheral portion of the opening. Each of the keys 31 is placed to be stacked on a dome portion of the inner rubber 37 being stacked on the substrate 35, the dome portion corresponding to a switch portion of the substrate 35.

Figure 4A:
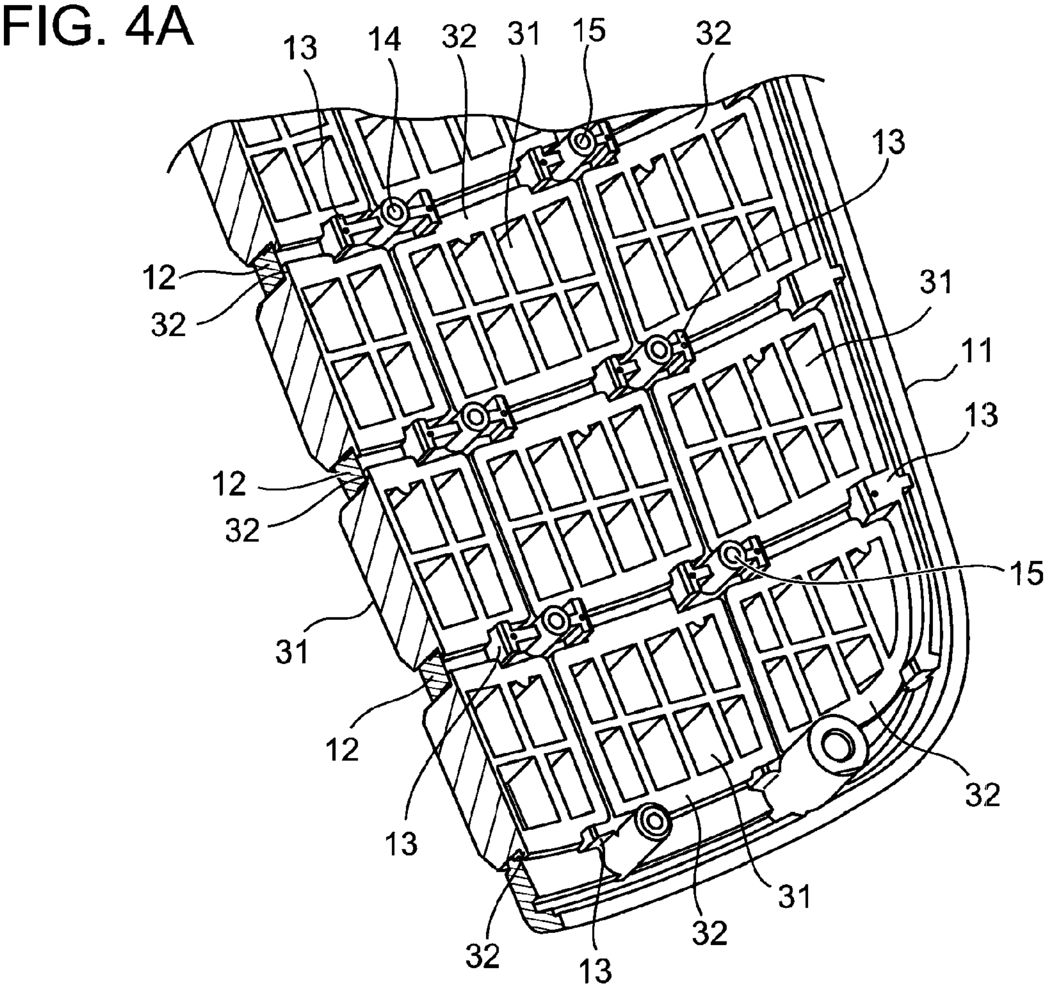
FIG. 4A is a partially-broken enlarged perspective view of an upper case in which keys of FIG. 1 are set, viewed from an under side.
Figure 4B:
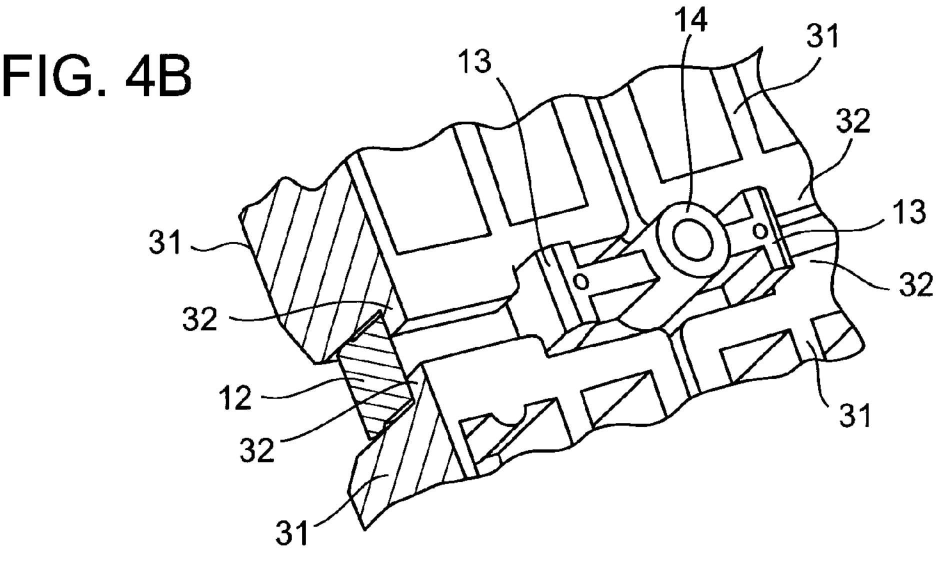
FIG. 4B is an enlarged view of a main part of FIG. 4A.

Each of FIGS. 4A and 4B is a view of the upper case 11 viewed from the under side thereof, into which upper case 11 the keys 31 are inserted. As shown in FIGS. 4A and 4B, positioning guides 13 are formed on back sides of the horizontal ribs 12. Each of positioning guides 13 abuts against side surfaces of the flanges 32 at upper/lower portions of the keys 31. Moreover, similar positioning guides 13 are formed at portions of the upper case 11, which portions are along a vertical direction of the opening in which the keys 31 are arranged. Concretely, the similar positioning guides 13 are formed on backsides of parts of the upper case 11, which parts are at a peripheral portion of the opening.

A boss 14 is formed integrally with each of the positioning guides 13 so as to be stacked on the inner rubber 37 which is stacked on the substrate 35. Furthermore, a projection 15 which is longer than the boss 14 is formed integrally with each of the positioning guides 13. In the illustrated example, the bosses 14 and the projections 15 are arranged alternately in a horizontal direction.

A backlash in the horizontal direction of the keys 31 is prevented by the abutting states of a right side surface and a left side surface of each of the flanges 32 against the positioning guides 13 of the ribs 12.

A backlash in the vertical direction of the keys 31 is prevented by the abutting state of an upper side surface and a lower side surface of each of the keys 31 against the ribs 12, and against an upper portion or a lower portion along the opening of the upper case 11.

Figure 5:
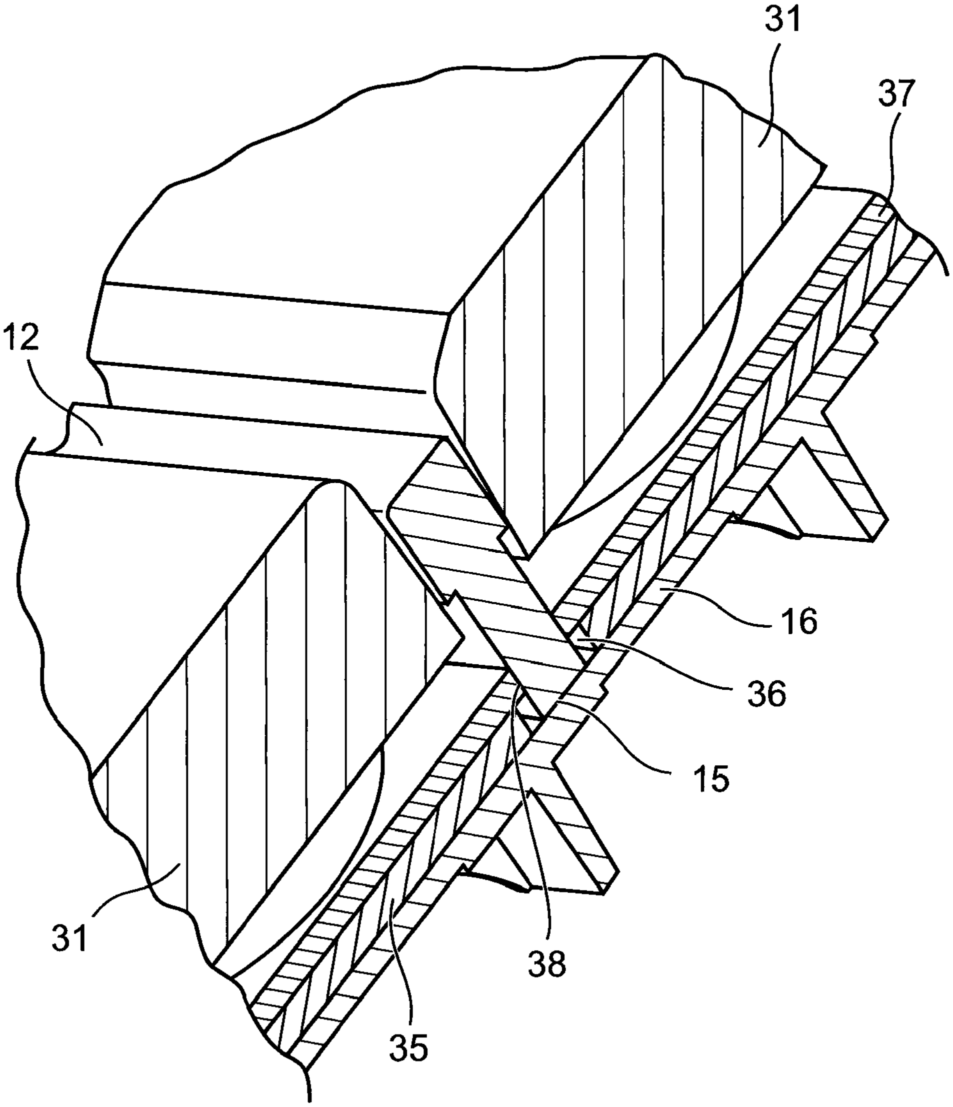
FIG. 5 is a partially-broken enlarged perspective view showing an engagement relation between a rib and a substrate.
Figure 6:
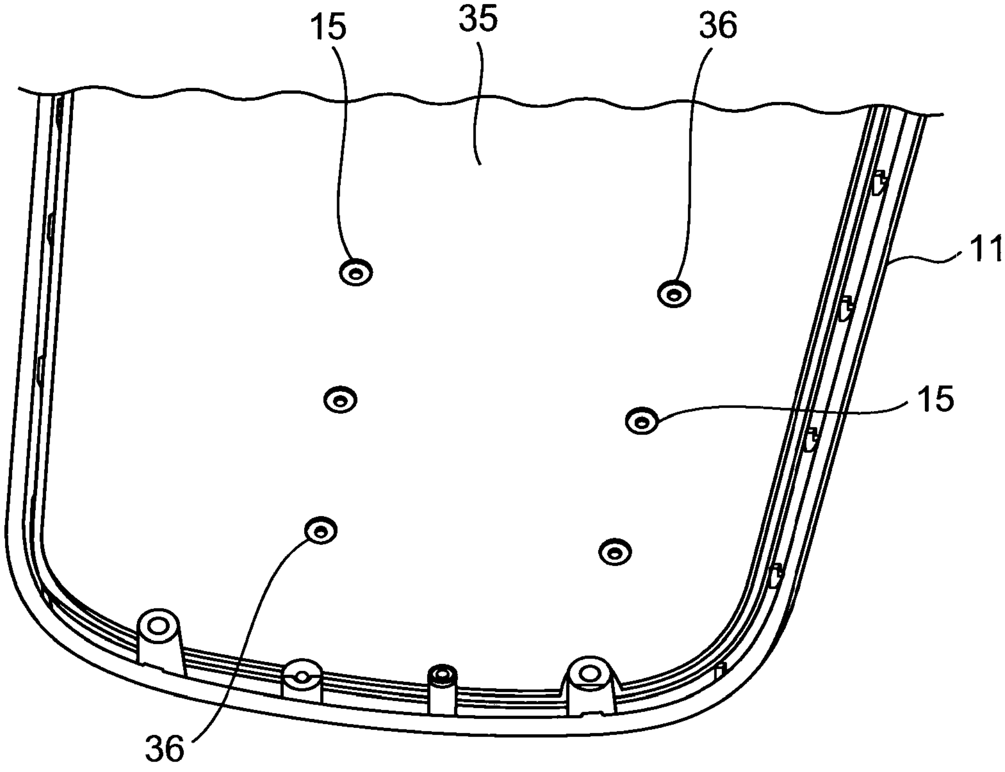
FIG. 6 is a perspective view of the substrate of FIG. 5, viewed from an under side.

Each of FIGS. 5 and 6 shows an engagement relation between each of the ribs 12 and the substrate 35. As shown in the drawings, a hole 36 into which each of the projections 15 of the ribs 12 is inserted is formed in the substrate 35. Moreover, a hole 38 through which each of the projections 15 of ribs 12 penetrates is formed in the inner rubber 37.

Thus, each of the projections 15 of the ribs 12 is engaged at two portions in the horizontal direction by penetrating the hole 38 of the inner rubber 37 and being inserted into the hole 36 of the substrate 35.

The substrate 35 is screwed to be fixed on the upper case 11. Beneath the substrate 35, a lower case 16 is stacked thereon. The lower case 16 is fixed on the upper case 11 by screwing a periphery of the lower case 16.

As described above, according to the desktop calculator of the embodiment, since the vertical ribs are cleared in the key device 3 in the lower portion of the desktop calculator and the opening is divided only by the horizontal ribs 12 for horizontally arranging the keys 31, the keys 31 can be arranged so as to be at most close portions to one another in the horizontal direction, and thereby the key device 3 can be miniaturized.

Furthermore, since each of the projections 15 of the horizontal ribs 12 is engaged at the two portions by penetrating through the hole 38 of the inner rubber 37 and being inserted in to the hole 36 of the substrate 35, rigidly of the horizontal ribs 12 can be ensured while clearing the vertical ribs, and thereby a strength of the chassis 1 can be ensured.

(Variation)

Although the example of the desktop calculator is described in the above embodiment, the present invention is not limited to this, and can be applied to all equipment such as camera, PDA, notebook computer, wearable personal computer, electronic dictionary, and cellular phone.

Moreover, though the above embodiment provide the horizontal ribs and clears the vertical ribs, it is also possible to clear the horizontal ribs and provide the vertical ribs.

Furthermore, the configuration such as shapes of keys and ribs is arbitrary, and it is a matter of course that other concrete detailed configuration and the like can be changed appropriately.

What is claimed is:

1. A key device comprising:

a chassis having an opening;

a substrate which is housed in the chassis;

at least one horizontal rib which is engaged with the substrate and which divides the opening in the chassis into a plurality of horizontally elongated spaces;

a plurality of keys which are arranged in at least one of the plurality of horizontally elongated spaces, wherein each of the keys has a flange for retaining the key in said at least one of the plurality of horizontally elongated spaces, and wherein the flange of each of said keys abuts against at least one of a backside of the at least one horizontal rib and a backside of a peripheral portion the chassis along said at least one of the plurality of horizontally elongated spaces; and a plurality of positioning guides formed on at least one of the backside of the at least one horizontal rib and the backside of the peripheral portion the chassis along said at least one of the plurality of horizontally elongated spaces, wherein each of the positioning guides respectively abuts against a side surface of the flange of one of said keys to horizontally position the keys along said at least one of the plurality of horizontally elongated spaces.

2. The key device according to claim 1, wherein a projection is formed on the at least one horizontal rib, and the projection is inserted into a hole formed in the substrate.

3. The key device according to claim 2, further comprising:

an inner rubber positioned between the plurality of keys and the substrate, wherein the projection penetrates through a hole formed in the inner rubber.

4. An electronic device which is equipped with the key device of claim 3.

5. An electronic device which is equipped with the key device of claim 1.

6. An electronic device which is equipped with the key device of claim 3.

* * * * *

UNITED STATES PATENT AND TRADEMARK OFFICE

CERTIFICATE OF CORRECTION

PATENT NO. : 8,665,609 B2
APPLICATION NO. : 13/083743
DATED : March 4, 2014
INVENTOR(S) : Shinichi Tamamoto et al.

It is certified that error appears in the above-identified patent and that said Letters Patent is hereby corrected as shown below:

In the Claims:

Column 4, Line 40 (Claim 4, Line 2):

"of claim 3" should be --of claim 1--.

Column 4, Line 42 (Claim 5, Line 2):

"of claim 1" should be --of claim 2--.

Signed and Sealed this
Twelfth Day of August, 2014

Michelle K. Lee
*Deputy Director of the United States Patent and Trademark Office*